United States Patent
Shim et al.

[11] Patent Number: 5,942,803
[45] Date of Patent: Aug. 24, 1999

[54] METHODS FOR FORMING OPENINGS WITH IMPROVED ASPECT RATIOS IN INTEGRATED CIRCUIT DEVICES, AND RELATED STRUCTURES

[75] Inventors: Myoung-seob Shim, Kyungki-do; Hun-chul Shin, Seoul; Kyung-seok Oh, Kyungki-do, all of Rep. of Korea

[73] Assignee: Samsung Electronics Co., Ltd., Rep. of Korea

[21] Appl. No.: 08/819,601

[22] Filed: Mar. 17, 1997

[30] Foreign Application Priority Data

Mar. 19, 1996 [KR] Rep. of Korea .................... 96-7378

[51] Int. Cl.[6] .................................................. H01L 23/48
[52] U.S. Cl. .......................... 257/774; 438/637; 438/638; 438/639
[58] Field of Search ..................... 257/774, 773, 257/775, 213; 438/637, 638, 639, 668, 622

[56] References Cited

U.S. PATENT DOCUMENTS

| | | | |
|---|---|---|---|
| 5,091,768 | 2/1992 | Yamazaki | 257/774 |
| 5,463,246 | 10/1995 | Matsunami | 257/774 |
| 5,519,239 | 5/1996 | Chu | 257/774 |
| 5,605,864 | 2/1997 | Prall | 437/195 |
| 5,684,331 | 11/1997 | Jun | 257/775 |
| 5,847,460 | 12/1998 | Liou et al. | 257/751 |

*Primary Examiner*—Carl Whitehead, Jr.
*Attorney, Agent, or Firm*—Myers Bigel Sibley & Sajovec

[57] ABSTRACT

A method for forming an opening in an integrated circuit device with an improved aspect ratio includes the following steps. An inter-insulating layer is formed on a surface of a substrate. A recess having a first width is then formed in the inter-insulating layer. Next, a hole having a second width is formed in the inter-insulating layer at a base of the recess, wherein the first width is greater than the second width. Thus, an opening is formed to have a cross-sectional shape of a step where its upper portion formed by the recess which is wider than its lower portion formed by the hole. Accordingly, open circuits caused by voids formed in the opening in subsequent metal deposition steps may be prevented.

11 Claims, 3 Drawing Sheets

METHODS FOR FORMING OPENINGS WITH IMPROVED ASPECT RATIOS IN INTEGRATED CIRCUIT DEVICES, AND RELATED STRUCTURES

FIELD OF THE INVENTION

The present invention relates to integrated circuits, and more particularly, to methods for forming contact and via holes in integrated circuits and related devices.

BACKGROUND OF THE INVENTION

In the fabrication of integrated circuit devices, openings such as contact holes and via holes are utilized to interconnect different layers of the integrated circuit device. For instance, a contact hole typically connects a semiconductor substrate to a conductive layer, and a via hole typically connects one conductive layer to another. According to conventional methods, contact holes and via holes (collectively referred to hereafter as contact holes) can be formed by exposing a portion of the semiconductor substrate or a surface of the conductive layer by etching an inter-insulating layer formed on the semiconductor substrate or the conductive layer.

As the integration density of integrated circuit devices increases to achieve higher speeds, higher level functionality, and smaller sizes, the area available for each cell of the integrated circuit device generally diminishes. Consequently, the area occupied by each contact hole of the cell may also be reduced. The site of a contact hole is of interest because the contact hole may affect process margins for subsequent processes. For instance, a small contact hole can increase the process margin for a subsequent step of forming a conductive layer that fills the contact hole. Accordingly, much attention is being paid to contact holes in an effort to advance the development of smaller contact holes and the corresponding methods for the fabrication of the same.

Various methods for forming contact holes have been proposed in the prior art. In particular, an example of one such method for forming a contact hole is described below with reference to FIGS. 1 to 3.

FIGS. 1 to 3 are sectional views showing steps of a method for forming a contact hole according to the prior art. With reference to FIG. 1, a field oxide film 12 for device isolation is formed on a semiconductor substrate 10. A wordline 14 and a first insulating layer 16 that insulates the wordline 14 are sequentially formed on the field oxide film 12. Next, an inter-insulating layer 18 is formed over the first insulating layer 16, providing a planar surface. An etching stop layer 20 is then formed by depositing polysilicon on the inter-insulating layer 18, and a second insulating layer 22 is formed by depositing an insulating material on the etching stop layer 20. Photoresist is then coated and patterned on the second insulating layer 22, thereby forming the photoresist pattern 24 to expose a portion of the second insulating layer 22 for forming a contact hole, as shown in FIG. 1.

With reference to FIG. 2, the second insulating layer 22 is patterned using the photoresist pattern 24 as an etching mask. The photoresist pattern 24 is removed and an oxide layer is deposited on the second insulating layer 22 and the etching stop layer 20. The oxide layer is then anisotropically etched to form an oxide spacer 26 on the sidewalls of the patterned second insulating layer 22. Next, the stop layer 20 is selectively etched using the oxide spacer 26 as an etching mask.

A contact hole (a) is then formed as shown in FIG. 3. In particular, the inter-insulating layer 18 and the first insulating layer 16 are etched using the spacer 26 as an etching mask to form the contact hole (a) exposing a portion of the semiconductor substrate 10. The second insulating layer 22 and the spacer 26 are then removed.

According to the method described above, the portion of the semiconductor substrate exposed by the patterned second insulating layer 22 is reduced by the size of the spacer 26. Therefore, the contact hole (a) formed by the above method may be smaller than that provided by a conventional photolithography process. The etching stop layer 20, which is preferably formed of polysilicon, may also prevent damage to the inter-insulating layer 18 during formation of the oxide spacer 26.

While the width of contact holes formed by the method discussed above can be reduced, reductions in width may result in corresponding increases in the aspect ratio of the contact hole. For purposes of this disclosure, the aspect ratio of a contact hole denotes a ratio of the height of the contact hole with respect to the width of the contact hole. In practice, the inter-insulating layer 18 illustrated in FIG. 3 may maintain a predetermined thickness while the width of the contact hole decreases when increasing the density of the integrated circuit device. As a result, the aspect ratio of the contact hole may be unfavorably increased.

When a conductive or metal layer is formed in a contact hole having an increased aspect ratio, the step coverage of the metal wiring in the contact hole may be poor. Thus, the prior method described herein may lead to a wire opening or a void within the contact hole.

SUMMARY OF THE INVENTION

It is therefore an object of the present invention to provide improved methods for forming contact holes and related structures.

It is another object of the present invention to provide methods for forming contact holes that may reduce the likelihood of a void in a metal wire formed therein.

These and other objects are provided according to the present invention by forming a recess in an inter-insulating layer and then forming a hole in the recess that exposes a surface of substrate, wherein the hole is narrower than the recess. The recess reduces the aspect ratio of the hole by essentially reducing the thickness of the inter-insulating layer at the point where the hole is formed. Therefore, the present invention improves the aspect ratio of the hole which may reduce the formation of a void or an open circuit in the contact hole in subsequent process steps.

A method for forming an opening in an integrated circuit device according to the present invention includes the following steps. An inter-insulating layer is formed on a surface of a substrate and an etching stop layer is formed on the inter-insulating layer. A recess is then formed by etching a first predetermined portion of the etching stop layer and the inter-insulating layer. Next, a spacer is formed on a sidewall of the recess, and the inter-insulating layer is etched again to a predetermined depth using the spacer as a mask so as to form a hole that is separated from the surface of the substrate by an unetched portion of the inter-insulating layer. The spacer and etching stop layer are then removed and the unetched portion of the inter-insulating layer is etched to expose a predetermined portion of the surface of the substrate, thereby forming the opening. The opening is formed to have a profile of a step where its upper portion formed by the recess is wider than its lower portion formed by the hole.

The step of removing the unetched portion may include the step of smoothing an upper edge portion of the recess. In addition, the step of forming the spacer may include the steps of depositing a layer of material to a thickness of less than half of a width of the recess and anisotropically etching the layer of material.

An integrated circuit device having an opening in accordance with the present invention includes a microelectronic substrate, and an inter-insulating layer on a surface of the microelectronic substrate, wherein the inter-insulating layer includes a hole exposing a predetermined portion of the surface. The hole has an upper portion with a first width, and a lower portion with a second width, wherein the first width is wider than the second width. It is preferable that the upper edge portion of the opening be smoothly sloped, thereby improving step coverage of the opening.

The methods and structures of the present invention can thus be used to provide integrated circuit devices with relatively small openings that may not be plagued by some of the problems which can occur with conventional small openings of the prior art, such as the formation of a void or an open circuit in the wiring.

DETAILED DESCRIPTION OF THE PREFERRED EMBODIMENTS

Figure 1:
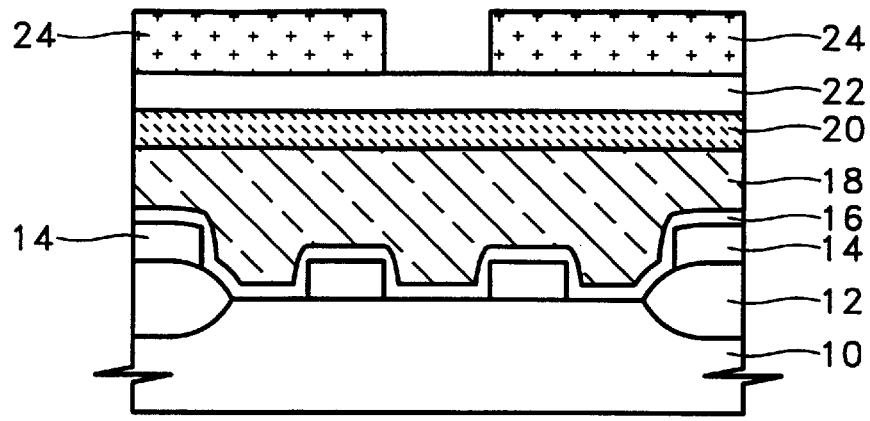
FIGS. 1 to 3 are cross-sectional views illustrating steps of a method for forming a contact hole according to the prior art.
Figure 2:
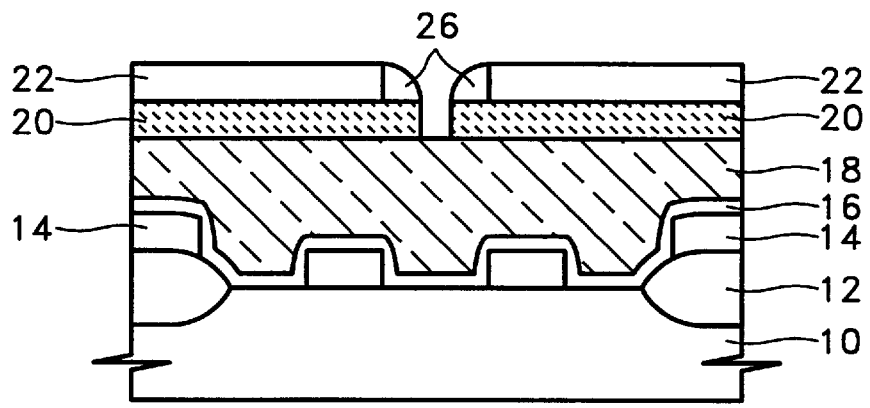
Figure 3:
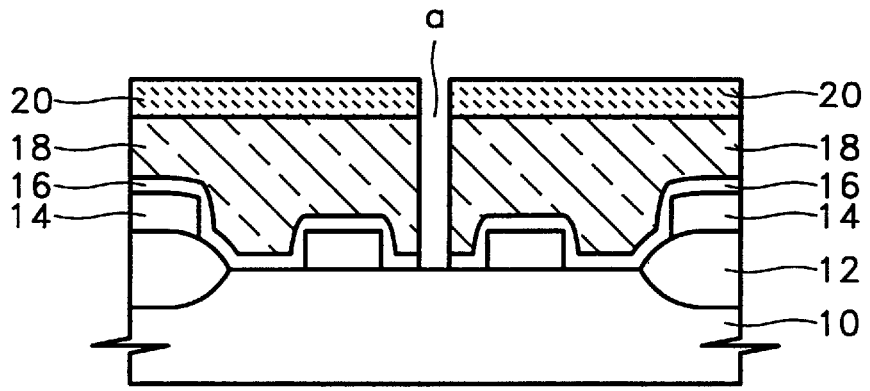

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of the layers and regions are exaggerated for clarity, and are not necessarily drawn to scale. Further, like reference numerals designate like elements throughout.

Figure 4:
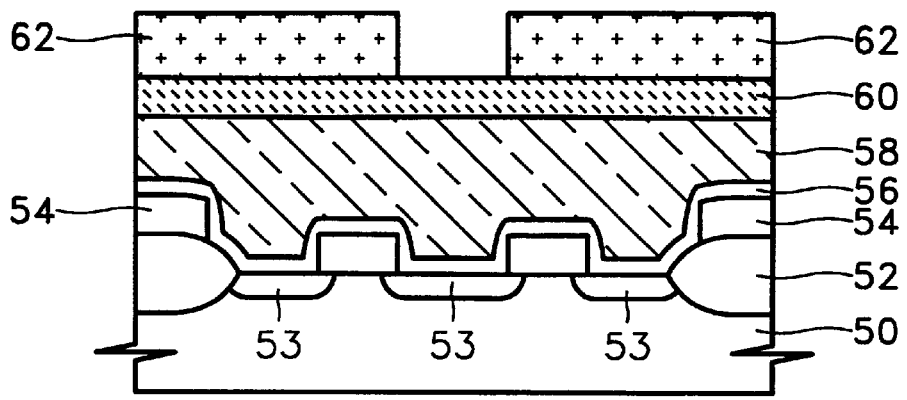
FIGS. 4 to 9 are cross-sectional views illustrating steps of a method for forming a contact hole according to the present invention.

In FIG. 4, the steps leading up to and including the formation of a photoresist pattern 62 are illustrated. Beginning with a semiconductor substrate 50, a field oxide film 52 for device isolation is formed on the semiconductor substrate 50. Source/drain regions 53 and gates 54 are then formed on the semiconductor substrate to provide memory cell transistors, as shown. A thin insulating layer 56 is formed to insulating the gates 54. An inter-insulating layer 58 is then formed on the thin insulating layer 56 to planarize and insulate the surface of the semiconductor substrate 50. Next, an etching stop layer 60 is formed on the inter-insulating layer 58 to prevent the inter-insulating layer 58 from being damaged during formation of the contact hole. A photoresist layer is then coated and patterned on the etching stop layer 60, thereby forming the photoresist pattern 62 for exposing a portion of the etching stop layer 60 through which a contact hole or a via hole is to be formed.

The inter-insulating layer 58 can be formed by depositing a flowable insulating material. For example, the inter-insulating layer can be formed from a doped oxide such as borosilicate glass (BSG), phosphosilicate glass (PSG) or borophosphosilicate glass (BPSG). Alternatively, the inter-insulating layer can be formed by depositing an undoped silicate glass (USG) such as a high temperature oxide (HTO) or low temperature oxide (LTO).

Figure 7:
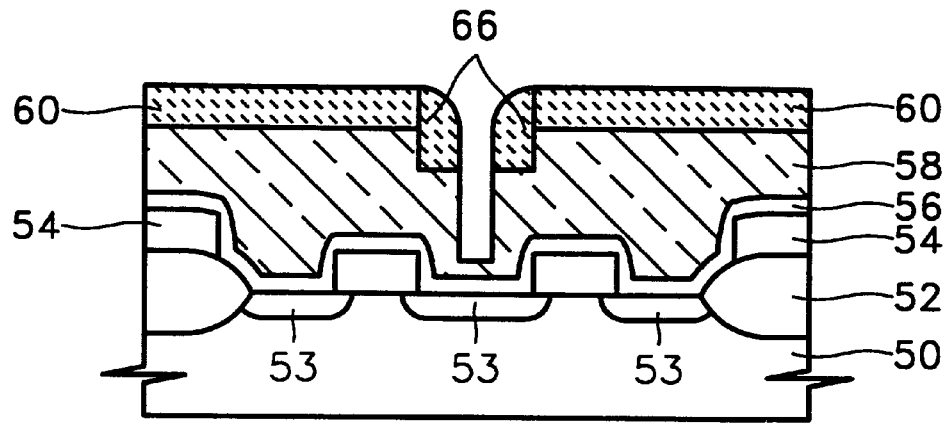

Preferably, the etching stop layer 60 is formed of a material having a lower etching rate than the material of the inter-insulating layer 58, with respect to a predetermined anisotropic etching technique. For example, the material of the etching stop layer 60 may include silicon nitride, silicon oxynitride, polycrystalline silicon, or amorphous silicon. In addition, it is preferable that the etching stop layer 60 be formed sufficiently thick to withstand the impact of the predetermined anisotropic etching technique, as described below with reference to FIG. 7.

Figure 5:
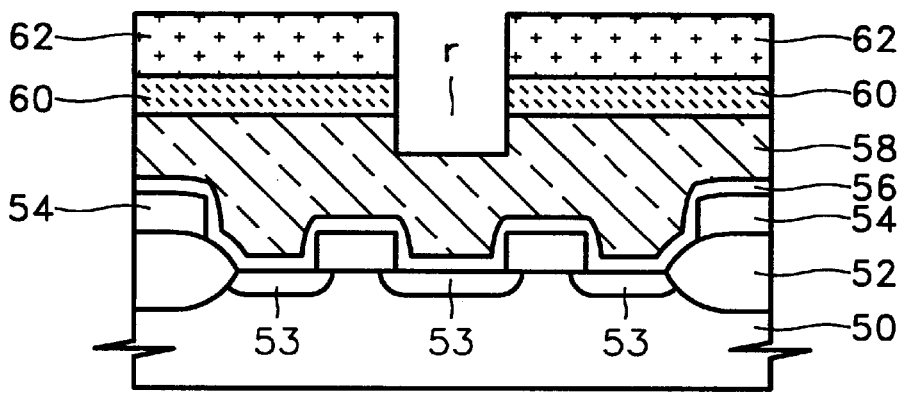

A recess (r) is formed in the surface of the inter-insulating layer 58 as shown in FIG. 5. Particularly, a portion of the etching stop layer 60 is removed by etching the etching stop layer 60 using the photoresist pattern 62 as an etching mask. The inter-insulating layer 58 is then etched to a predetermined depth using the photoresist layer 62 as an etching mask.

Figure 6:
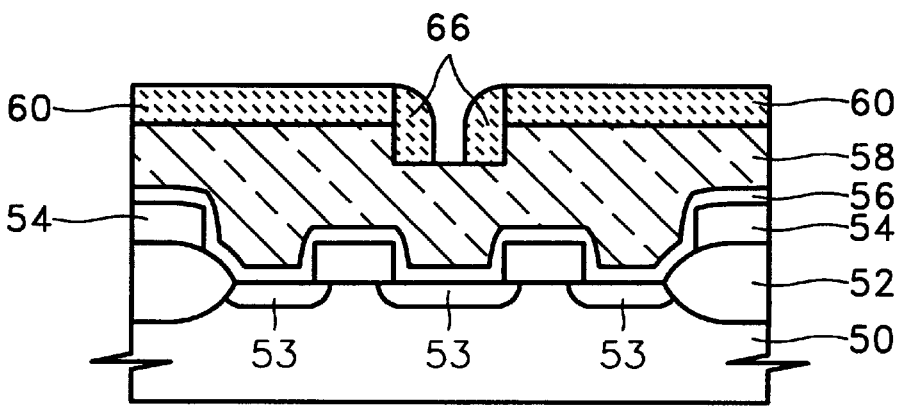

A spacer 66 is formed on the sidewalls of the recess (r) as shown in FIG. 6. The photoresist pattern 62 is initially removed and a material is deposited on the etching stop layer 60 and recess (r) so as to form a material layer. Preferably, the deposited material has an etching rate lower than that of the inter-insulating layer 58, and which corresponds to the material of the etching stop layer 60. Examples of suitable materials are silicon nitride (SiN), silicon oxynitride, polysilicon or amorphous silicon. The material layer is then anisotropically etched to form the spacer 66 as illustrated in FIG. 6.

It is noted that the size of a contact hole is determined by the width of the spacer 66, which in turn is determined by the thickness of the material layer. Preferably, the material layer is deposited to have a thickness less than ½ of the width of the recess (r) so as not to fill the recess (r).

The inter-insulating layer 58 is then etched to a predetermined depth is as shown in FIG. 1. A portion of the inter-insulating layer 58 in which a contact hole is to be formed is etched using the spacer 66 as an etching mask. Preferably, the inter-insulating layer 58 is etched to a predetermined depth that leaves approximately 10% or less (i.e., under 1000 Å) of the thickness of the inter-insulating layer 58 unetched. This is to reduce damage to either the semiconductor substrate 50 or a conductive layer opposite the contact hole during the removal of the etching stop layer 60 and the spacer 66.

Figure 8:
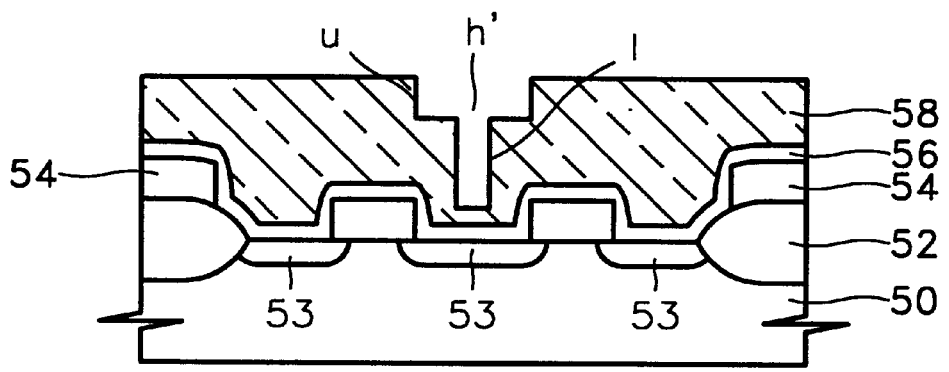

In FIG. 8, the step of removing the etching stop layer 60 and the spacer 66 is illustrated. Particularly, the etching stop layer 60 and the spacer 66 can be removed using an isotropic etching technique. Thus, a hole (h') with a lower part (l) and a relatively wider upper part (u) is formed in the inter-insulating layer 58 in which a contact hole is to be formed.

Figure 9:
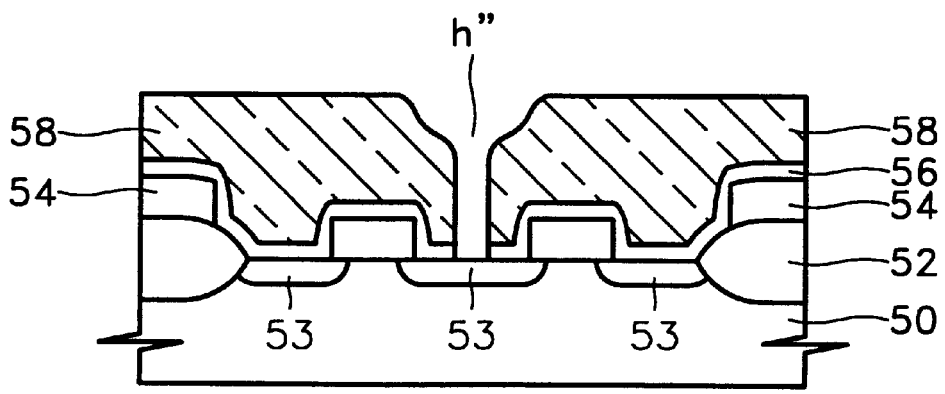

The relatively small contact hole (h") is completed, thus exposing a portion of the substrate as shown in FIG. 9. The unetched inter-insulating layer 58 opposite the hole (h') is removed by blanket-etching the inter-insulating layer 58. In addition, a portion of the inter-insulating layer 58 corresponding to the upper part (u), as shown in FIG. 8, is also etched by the blanket etching such that the upper edge portion of the resultant contact hole (h") is smoothly sloped. This improves the step coverage of the contact hole (h") during subsequent film deposition processes.

A transistor may be further formed on the semiconductor substrate 50 prior to forming the inter-insulating layer 58, and thus, the opening as previously described functions as a contact hole which partially exposes the semiconductor substrate 50. In particular, the contact hole may expose source/drain region 53 of a memory cell transistor between two word lines. According to another aspect of the present invention, a conductive layer may be formed on the semiconductor substrate 50 prior to forming the inter-insulating layer 58, and thus, the opening as previously described may function as a via hole partially exposing the conductive layer.

A method according to the present invention includes two etching steps for the inter-insulating layer 58 to form the contact hole (h") which has an upper portion (u) and a narrower lower portion (l). Thus, step coverage during subsequent film depositing steps (e.g., a metal film which is formed by a sputtering method) may be improved because the aspect ratio of the lower portion (l) is improved by reducing its height by the height of the upper portion (u). Accordingly, open circuits caused by voids formed during subsequent deposition steps within the opening may be prevented.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an opening in an integrated circuit device, comprising the steps of:

forming an insulating layer on a surface of a substrate;

forming an etching stop layer on said insulating layer;

after forming said etching stop layer, forming a recess with a first width and a base in said insulating layer wherein said recess includes a side wall adjacent said base wherein said base is substantially parallel to said substrate, and wherein said side wall is substantially perpendicular to said base;

forming a spacer on a sidewall of said recess;

after forming said spacer, forming a hole with a second width in said inter-insulating layer at said base of said recess, wherein said first width is greater than said second width wherein said spacer is used as an etching mask during the step of forming said hole, wherein said etching stop layer is used as an etching mask during the steps of forming said recess and forming said hole, and wherein the step of forming said hole includes etching said insulating layer to a predetermined depth so as to form a hole that is separated from said surface of said substrate by an unetched portion of said insulating layer; and removing said unetched portion to expose a portion of said surface of said substrate wherein the step of removing said unetched portion includes smoothing an upper portion of a side wall of said recess.

2. The method of claim 1, wherein said etching stop layer comprises a material that is selected from the group consisting of silicon nitride, silicon oxynitride, polycrystalline silicon, and amorphous silicon.

3. The method of claim 1, wherein the step of forming said spacer includes depositing a layer of material to a thickness less than half of said first width and anisotropically etching said layer of material to form said spacer.

4. The method of claim 1, wherein said insulating layer is formed of an oxide.

5. The method of claim 1, further comprising the step of forming a memory cell transistor including a source/drain region on said substrate before the step of forming said insulating layer, wherein said opening exposes a portion of said source/drain region.

6. The method of claim 1, further comprising the step of forming a conductive layer on said substrate before the step of forming said insulating layer, wherein said opening exposes a portion of said conductive layer.

7. A method of forming an integrated circuit memory device, comprising the steps of:

forming a memory cell transistor including a source/drain region in a substrate;

forming an insulating layer on said substrate and said memory cell transistor;

forming an etching stop layer on said insulating layer;

after forming said etching stop layer, forming a recess with a first width and a base in said insulating layer wherein said recess includes a side wall adjacent said base, wherein said base is substantially parallel to said substrate, and wherein said side wall is substantially perpendicular to said base;

forming a spacer on a side wall of said recess; and after forming said spacer, forming a hole with a second width in said insulating layer at said base of said recess exposing said source/drain region, wherein said first width is greater than said second width wherein said etching stop layer is used as an etching mask during the steps of forming said recess and forming said hole wherein said spacer is used as an etching mask during the step of forming said hole, and wherein the step of forming said hole includes smoothing an upper edge portion of a side wall of said recess.

8. The method of claim 7, wherein said etching stop layer comprises a material that is selected from the group consisting of silicon nitride, silicon oxynitride, polycrystalline silicon, and amorphous silicon.

9. The method of claim 7, wherein the step of forming said spacer includes depositing a layer of material to a thickness less than half of said first width and anisotropically etching said layer of material to form said spacer.

10. The method of claim 7, wherein said insulating layer is formed of an oxide.

11. The method of claim 10, wherein said oxide comprises a material selected from a group consisting of high temperature oxide (HTO), borophosphosilicate glass (BPSG), phosphosilicate glass (PSG), borosilicate glass (BSG) and low temperature oxide (LTO).

* * * * *